(12) United States Patent
Kim et al.

(10) Patent No.: US 12,024,792 B2
(45) Date of Patent: Jul. 2, 2024

(54) DIAMOND CRYSTAL

(71) Applicant: Orbray Co., Ltd., Tokyo (JP)

(72) Inventors: Seongwoo Kim, Tokyo (JP); Daiki Fujii, Tokyo (JP); Yutaka Kimura, Tokyo (JP); Koji Koyama, Tokyo (JP)

(73) Assignee: Orbray Co., Ltd., Tokyo (JP)

( * ) Notice: Subject to any disclaimer, the term of this patent is extended or adjusted under 35 U.S.C. 154(b) by 0 days.

(21) Appl. No.: 16/090,154

(22) PCT Filed: Mar. 29, 2018

(86) PCT No.: PCT/JP2018/013131
§ 371 (c)(1),
(2) Date: Sep. 28, 2018

(87) PCT Pub. No.: WO2019/186862
PCT Pub. Date: Oct. 3, 2019

(65) Prior Publication Data
US 2021/0198803 A1    Jul. 1, 2021

(51) Int. Cl.
| | | |
|---|---|---|
| C30B 29/04 | (2006.01) | |
| C30B 25/02 | (2006.01) | |
| C30B 25/18 | (2006.01) | |
| C30B 29/60 | (2006.01) | |

(52) U.S. Cl.
CPC .............. *C30B 29/04* (2013.01); *C30B 25/02* (2013.01); *C30B 25/183* (2013.01); *C30B 29/60* (2013.01)

(58) Field of Classification Search
CPC ......... C30B 29/04; C30B 29/60; C30B 25/02; C30B 25/183
See application file for complete search history.

(56) References Cited

U.S. PATENT DOCUMENTS

| | | |
|---|---|---|
| 5,443,032 A | 8/1995 | Vichr et al. |
| 5,483,084 A | 1/1996 | Hirabayashi |
| 5,523,160 A | 6/1996 | Kobashi et al. |
| 5,803,967 A | 9/1998 | Plano et al. |
| 2018/0190774 A1 * | 7/2018 | Aida ................. H01L 21/02527 |

FOREIGN PATENT DOCUMENTS

| | | | |
|---|---|---|---|
| CN | 101443476 | 5/2009 | |
| CN | 105579624 | 5/2016 | |
| CN | 107267954 | 10/2017 | |
| EP | 0 589 464 | 3/1994 | |
| EP | 3 054 036 | 8/2016 | |
| EP | 3 103 898 A1 | 12/2016 | |
| EP | 3 330 414 | 6/2018 | |
| JP | H06-183892 | 7/1994 | |
| JP | A 1994-263595 A | 10/1995 | |
| JP | A 1997-020589 | 1/1997 | |
| JP | 2004-210559 A | 7/2004 | |
| JP | 3549227 | 8/2004 | |
| JP | 2017-214284 A | 12/2017 | |
| JP | WO 2017/022647 | 5/2018 | |
| WO | WO 2017022647 | 2/2017 | |
| WO | WO-2017022647 A1 * | 2/2017 | ........... C30B 25/186 |

OTHER PUBLICATIONS

European Search Report for European Application No. 18769941.8 dated Dec. 4, 2019, 12 pages, Germany.

Klein Oliver et al., Propagation and annihilation of threading dislocations during off-axis growth of heteroepitaxial diamond films, Diamond and Related Materials, Elsevier Science Publishers, Jan. 27, 2016, pp. 53-58, vol. 65, 12 pages, Amsterdam, NL.

Boussadi, A. et al., Reduction of dislocation densities in single crystal CVD diamond by confinement in the lateral sector, Diamond and Related Materials, Elsevier Science Publishers, Feb. 13, 2018, pp. 162-169, vol. 83, 8 pages, Amsterdam, NL.

Tarutani M et al., Transmission electron microscopy study of interface and internal defect structures of homoepitaxial diamond, Applied Physics Letters, A I P Publishing LLC, Apr. 8, 1996, vol. 68, No. 15, pp. 2070-2072, 3 pages, United States.

Seong-Woo Kim et al., Two-inch high-quality (001) diamond heteroepitaxial growth on sapphire (1120) misoriented substrate by step-flow mode, Applied Physics Express, Sep. 3, 2021, 7 pages, vol. 14, Saga University, Tokyo, Japan.

Takeda, Heteroepitaxial Growth and Heterostructure—Nanoscale nondestructive viewing of the resulting structure, Applied Physics, 2002, pp. 9, vol. 5.

* cited by examiner

*Primary Examiner* — Yong L Chu
(74) *Attorney, Agent, or Firm* — Thorpe North & Western

(57) ABSTRACT

As the diamond crystal, a diamond crystal in a bulk form including dislocation concentration regions is formed. An interval between each of the dislocation concentration regions is from 10 nm to 4000 nm. The crystal orientation of crystal main face at the surface of the diamond crystal is any one of (100), (111), or (110). An external shape of the diamond crystal in a surface direction is a rectangle, a circle, or a circle having an orientation flat plane. The rectangle is set to have a side length of not less than 8.0 mm. The circle is set to have a diameter of not less than 8.0 mm.

2 Claims, 2 Drawing Sheets

DIAMOND CRYSTAL

TECHNICAL FIELD

The present technology relates to a diamond crystal.

BACKGROUND ART

A diamond crystal is expected to be an ultimate semiconductor material. This is because diamond crystal has many characteristics such as high thermal conductivity, high electron mobility and high hole mobility, high dielectric breakdown field strength, a low dielectric loss, and a wide band gap, making the diamond crystal the most suitable and excellent material for a semiconductor. The band gap of the diamond crystal is about 5.5 eV, which is particularly large among existing semiconductor materials. In particular, an ultraviolet light emitting element which utilizes a wide band gap, and a field effect transistor, a cooling plate, and the like having excellent high-frequency characteristics have been developed in recent years.

In consideration of use of the diamond crystal for semiconductor applications, the diamond crystal is required to have a size having a diameter of several inches. This is because in a case of using a device used in a production line for semiconductors formed from Si (silicon) or the like for the diamond crystal, it is difficult to apply a small substrate with a diameter of less than several inches to the device.

Further, the diamond crystal is required to have not only a required size but also a high orientational property. In a diamond crystal, there are a single crystal and a polycrystal. A so-called polycrystalline diamond has grain boundaries between crystal grains of the diamond crystal. A carrier may be scattered or trapped by the grain boundary. Therefore, although a polycrystalline diamond with a diameter of several inches can be formed, the polycrystalline diamond has a problem such as inferior electrical characteristics.

In contrast, the electrical characteristics of a single crystal diamond do not deteriorate. However, at present, an available single crystal diamond has a cubic shape with a side of only up to about 5.0 mm. Therefore, the single crystal diamond cannot be applied to the conventional semiconductor production line as described above. Accordingly, there is a problem in that the single crystal diamond is too small to be used for applications of electronic components.

Japan Patent No. 3549227 discloses a diamond crystal which has a high orientational property and can be formed to a larger area.

The diamond crystal described in Japan Patent No. 3549227 is a diamond thin film formed by vapor phase epitaxy on a Si substrate with (100) orientation. Furthermore, at least 95% of surface area of the thin film is configured with the (100) crystal plane of diamond, and for the adjacent (100) crystal planes, the differences {$\Delta\alpha$, $\Delta\beta$, $\Delta\gamma$} of the Euler angles {$\alpha$, $\beta$, $\gamma$}, which indicate the orientation of the crystal planes, satisfy $|\Delta\alpha|\leq 1°$, $|\Delta\beta|\leq 1°$, and $|\Delta\gamma|\leq 1°$ simultaneously. Due to the structure of such a diamond crystal, a diamond thin film with low density grain boundaries, a high carrier mobility, and a large area is obtained.

However, the diamond crystal described in Japan Patent No. 3549227 still contained the grain boundaries. Therefore, even in a case where the large area of the diamond crystal is achieved, as long as the diamond crystal has the grain boundaries, the area usable as a semiconductor is limited to the area in which a grain boundary is absent. Elimination of the grain boundaries is necessary to increase the area for semiconductor applications.

As the size of diamond crystal increases subsequent to achieving elimination of the grain boundaries, the number of regions where dislocations are concentrated in the diamond crystal also increases. The present inventors have tested, in addition to an increase in size, a relationship between an interval between each of the dislocation concentration regions and the orientational property of the diamond crystal.

Note that, the dislocation concentration region refers to a region of high dislocation concentration that extends toward the inside of the diamond crystal and is elongated along the thickness of the diamond crystal (in a growth direction of the diamond crystal) (see Japan Patent No. 6269368 as a reference). In addition, a domain refers to a region surrounded by the dislocation concentration regions.

The present inventors have tested and discovered that as the number of the dislocation concentration regions increases, a stress is likely to be released form the whole diamond crystal. However, as the width of each domain increases, the interval between each of the dislocation concentration regions also increases. Thus, the number of the dislocation concentration regions in the whole diamond crystal is reduced. Therefore, a stress is unlikely to be released from each of the dislocation concentration regions to the outside of the diamond crystal. Accordingly, the amount of warping of the whole diamond crystal increases due to the stress, and thereby increasing an influence of the amount of warping on the full width at half maximum (FWHM) of diffraction peak from a diamond (400) plane in the measurement of rocking curve using an X ray, resulting in an increase in the FWHM.

On the other hand, in a case where the width of each domain is small, the number of the dislocation concentration regions in the whole diamond crystal increases. Therefore, a stress is likely to be released from each of the dislocation concentration regions to the outside of the diamond crystal and the amount of warping of the whole diamond crystal is reduced. However, the number of domains in the whole diamond crystal increases as the width of each of the domains decreases. Therefore, an influence of angle deviation among domains on the FWHM increases, also resulting in an increase in the FWHM.

SUMMARY

The present technology provides a diamond crystal which can be formed to a larger area, and has a high orientational property and a reduced FWHM.

A diamond crystal of the present technology is a crystal in a bulk form including dislocation concentration regions. An interval between each of the dislocation concentration regions is from 10 nm to 4000 nm.

In an embodiment of the diamond crystal of the present technology, the crystal orientation of crystal main face at a surface of the diamond crystal is preferably any one of (100), (111), or (110).

In another embodiment of the diamond crystal of the present technology, the external shape in a surface direction is a rectangle, a circle, or a circle having an orientation flat plane. In a case where the external shape is a rectangle, the rectangle preferably has a side length of not less than 8.0 mm. In a case where the external shape is a circle, the circle preferably has a diameter of not less than 8.0 mm.

The diamond crystal of the present technology has no grain boundary. Further, though a diamond crystal has dislocation concentration regions, it has an orientation property sufficient for practical applications, with a reduced dispersion where the average of FWHMs measured at a plurality of positions at the surface of the diamond crystal is not greater than 500 seconds and the standard deviation is from 10 seconds to 80 seconds. Such a diamond crystal can be realized by optimizing the interval between each of the dislocation concentration regions.

While the diamond crystal is a crystal in a bulk form and has dislocation concentration regions, this diamond crystal is allowed to have a variation in the orientation of crystal axis in some parts. Thus, the tolerance in orientation can be set to a larger value as compared to that of a single crystal. Then, a large diamond crystal can be more easily formed.

In addition, the crystal orientation of crystal main face at the surface of the diamond crystal is any one of (100), (111), or (110), and thus the diamond crystal can be highly versatile in application such as formation of elements and devices or use as an underlying substrate for growth of diamond.

In addition to the effects described above, a large diamond crystal which has, as an external shape in a surface direction, a rectangle, a circle, or a circle having an orientation flat plane, and in which in a case where the external shape is a rectangle, the rectangle has a side length of not less than 8.0 mm, and in a case where the external shape is a circle, the circle has a diameter of not less than 8.0 mm, can be formed as a crystal having no grain boundaries. Therefore, the diamond crystal of the present technology can be applied to a semiconductor production line, and used for applications of electronic components and the like.

DETAILED DESCRIPTION

Figure 1:
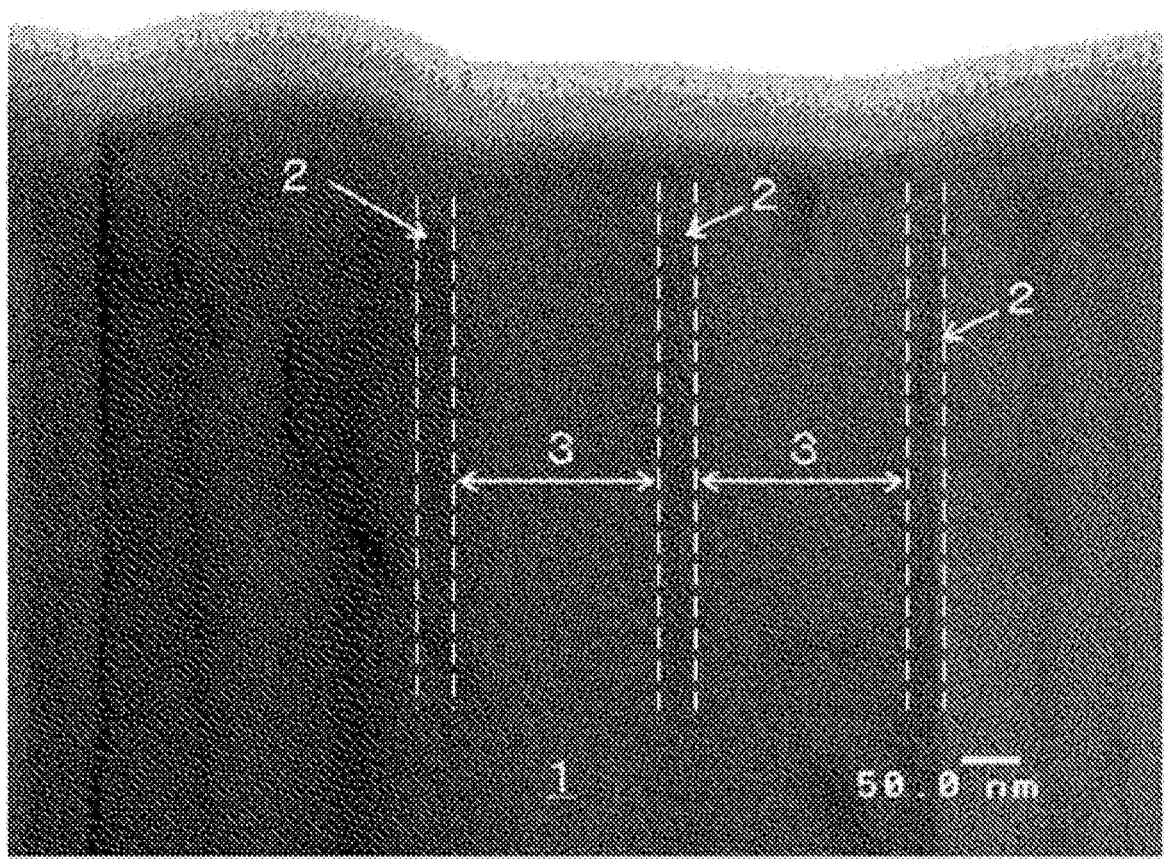
FIG. 1 is a TEM (Transmission Electron Microscopy) image of diamond crystal in an embodiment and Example of the present technology.

In a first aspect of an embodiment of the present technology, a diamond crystal is a crystal in a bulk form including dislocation concentration regions. In the diamond crystal, an interval between each of the dislocation concentration regions is from 10 nm to 4000 nm.

According to this configuration, the diamond crystal has no grain boundaries. Further, though the diamond crystal has dislocation concentration regions, it has an orientational property sufficient for practical applications, with a reduced dispersion where the average of FWHMs measured at a plurality of positions at a surface thereof is not greater than 500 seconds and the standard deviation is from 10 seconds to 80 seconds. Such a diamond crystal can be realized by optimizing the interval between each of the dislocation concentration regions.

While the diamond crystal is a crystal in a bulk form and has dislocation concentration regions, this diamond crystal is allowed to have a variation in the orientation of crystal axis in some parts. Thus, the tolerance in orientation can be set to a larger value as compared to that of a single crystal. Then, a large diamond crystal can be more easily formed.

Note that, the dislocation concentration herein refers to a region of dislocation concentration that extends toward the inside of the diamond crystal and is elongated along the thickness of the diamond crystal (in a growth direction of the diamond crystal). In addition, a domain refers to a region surrounded by the dislocation concentration regions.

FWHM refers to a FWHM value of diffraction peak from a (400) plane of diamond in the measurement of an X-ray rocking curve (XRC) in a case where a width of slit of incident X ray is 0.5 mm×0.5 mm.

The crystal in a bulk form refers to an independently existing crystal that has a plurality of dislocation concentration regions wherein the interval between each of the dislocation concentration regions is from 10 nm to 4000 nm, does not contain a binder at the dislocation concentration regions, and has domains that are each formed through the dislocation concentration regions (more particularly, surrounded by the dislocation concentration regions) and have a high orientational property. Further, the crystal in a bulk form includes a crystal that has a high orientational property and of which the orientation of optional crystal axis of interest partially varies.

The binder described above includes a sintering agent and a binding material. For example, the sintering agent includes an iron-group metal such as iron (Fe), cobalt (Co), and nickel (Ni), and a carbonate such as calcium carbonate ($CaCO_3$). For example, the binding material includes ceramics. Examples of ceramics include silicon carbide (SiC).

The high orientational property means that the average of FWHMs of X-ray rocking curves measured at a plurality of positions at a surface of the diamond crystal is not greater than 500 seconds. More preferably, the standard deviation of FWHMs is from 10 seconds to 80 seconds. As threshold values for the high orientational property in an embodiment according to the present technology, the average of FWHMs is set to not greater than 500 seconds and the standard deviation of FWHMs is set to from 10 seconds to 80 seconds. These ranges are determined according to the opinions of the present inventors, that these values express orientational property required for semiconductor applications although the diamond crystal has no grain boundaries and dislocation concentration regions.

The independently existing crystal includes a crystal that can not only keep its shape but also have a strength that does not impair the handling.

In a second aspect of the embodiment, the crystal orientation of crystal main face at the surface of the diamond crystal is any one of (100), (111), or (110).

According to this configuration, the crystal orientation of crystal main face at the surface of the diamond crystal is any one of (100), (111), or (110), and thus the diamond crystal having such a configuration can be highly versatile in application such as formation of elements and devices or use as an underlying substrate for growth of diamond.

In a third aspect of the embodiment, the external shape of the diamond crystal in a surface direction is a rectangle, a circle, or a circle having an orientation flat plane. In a case of the rectangle, the length of a side is not less than 8.0 mm. In a case of the circle, the diameter is not less than 8.0 mm.

According to this configuration, a large diamond crystal which has, as an external shape in a surface direction, a rectangle, a circle, or a circle having an orientation flat plane, and in which in a case where the external shape is a rectangle, the rectangle has a side length of not less than 8.0 mm, and in a case where the external shape is a circle, the circle has a diameter of not less than 8.0 mm, can be formed as a crystal having no grain boundaries. Therefore, the diamond crystal of the embodiment can be applied to a semiconductor production line, and used for applications of electronic components and the like.

In the present technology, for measurement of average and standard deviation of FWHMs of X-ray rocking curves at a surface of a diamond crystal having a side or diameter of not less than 8.0 mm, FWHM measurements are performed at positions separated from each other by a distance of 2.0 mm at the surface of the diamond crystal.

Hereinafter, a diamond crystal according to an embodiment of the present technology will be described with reference to FIG. 1. The diamond crystal of the embodiment is a crystal in a bulk form having no grain boundaries and having a plurality of dislocation concentration regions. The diamond crystal contains not greater than 1.0 ppm of nitrogen.

As an example of the embodiment, FIG. 1 is an image obtained by observation with TEM of a part of a diamond crystal 1 of which the interval between each of the dislocation concentration regions is from 10 nm to 4000 nm. The dislocation concentration region refers to a region of dislocation concentration that extends toward the inside of the diamond crystal and is elongated in the thickness direction of the diamond crystal (in a growth direction of the diamond crystal). The up-and-down direction in FIG. 1 is the thickness (growth direction) of the diamond crystal 1. Each linear, comparatively darker region indicated by reference number 2 is the dislocation concentration region. The interval between each of the dislocation concentration regions is an interval between the dislocation concentration regions 2 indicated by an arrow 3 in FIG. 1.

The crystal in a bulk form refers to an independently existing crystal that has a plurality of dislocation concentration regions, wherein the interval between each of the dislocation concentration regions is from 10 nm to 4000 nm, does not contain a binder at the dislocation concentration regions, and has domains that are each formed through the dislocation concentration regions and have a high orientational property. More particularly, the domains that are each formed through the dislocation concentration regions refers to domains formed so as to be surrounded by the dislocation concentration regions.

Further, the crystal in a bulk form includes a crystal that has a high orientational property and of which the orientation of optional crystal axis of interest partially varies.

The binder includes a sintering agent and a binding material. For example, the sintering agent includes an iron-group metal such as iron (Fe), cobalt (Co), and nickel (Ni), and a carbonate such as calcium carbonate ($CaCO_3$). For example, the binding material includes ceramics. Examples of ceramics include silicon carbide (SiC).

The high orientational property means that the average of FWHMs of X-ray rocking curves measured at a plurality of positions at a surface of the diamond crystal is not greater than 500 seconds. More preferably, the standard deviation of FWHMs is from 10 seconds to 80 seconds. FWHM refers to a FWHM value of diffraction peak from a (400) plane of diamond in the measurement of X-ray rocking curve in a case where a width of slit for incident X ray is 0.5 mm×0.5 mm. The diamond crystal thus formed has been tested and the relationship between the interval between each of the dislocation concentration regions, and the average and standard deviation of FWHMs has been found.

As threshold values for the high orientational property in the embodiment, the average of FWHMs is set to not greater than 500 seconds and the standard deviation of FWHMs is set to from 10 seconds to 80 seconds. These ranges are determined according to the opinions of the present inventors, that these values express orientational property required for semiconductor applications although the diamond crystal has no grain boundaries and dislocation concentration regions.

It is confirmed that in a case where the interval between each of the dislocation concentration regions is less than 10 nm, a diamond crystal does not grow. Since the diamond crystal does not grow, FWHM cannot be measured. On the other hand, the present inventors have tested and confirmed that in a case where the interval between each of the dislocation concentration regions is greater than 4000 nm, the average of FWHMs is greater than 500 seconds.

For semiconductor formation applications, the surface roughness Ra of surface of the diamond crystal is preferably less than 1 nm, and more preferably not greater than 0.1 nm, which achieves flatness at the atomic level. The surface roughness Ra may be measured by a surface roughness measurement device.

The independently existing crystal includes a crystal that can not only keep its shape but also have a strength that does not impair the handling. The thickness is preferably not less than 0.3 mm to achieve such a strength. The diamond crystal is an extremely rigid material and therefore the upper limit of the thickness is preferably not greater than 3.0 mm in consideration of easy cleavage and the like after formation of elements and devices. The thickness of a diamond crystal that is the most frequently used for elements and devices and independently exists is most preferably from 0.5 mm to 0.7 mm (from 500 μm to 700 μm).

The external shape of the diamond crystal in a surface direction is a rectangle, a circle, or a circle having an orientation flat plane. In a case of the rectangle, the length of a side is not less than 8.0 mm. In a case of the circle, the diameter is not less than 8.0 mm.

With the diamond crystal of the embodiment, a large diamond crystal which has, as an external shape in a surface direction, a rectangle, a circle, or a circle having an orientation flat plane, in a case where the external shape is a rectangle, the rectangle has a side length of not less than 8.0 mm, and in a case where the external shape is a circle, the circle has a diameter of not less than 8.0 mm, can be formed as a crystal having no grain boundaries. Therefore, the diamond crystal of the embodiment can be applied to a semiconductor production line, and used for applications of electronic components and the like.

The upper limit value of external dimension of the diamond crystal is not particularly limited, but the side length or diameter is preferably not greater than 8 inches (about 203.2 mm) in terms of practical use.

In addition, for measurement of average and standard deviation of FWHMs of X-ray rocking curves at a surface of a diamond crystal having a side length or diameter of not less than 8.0 mm, FWHM measurements are performed at positions separated from each other by a distance of 2.0 mm at the surface of the diamond crystal.

The crystal orientation of crystal main face at the surface of the diamond crystal is any one of (100), (111), or (110).

According to this configuration, the crystal orientation of crystal main face at the surface of the diamond crystal is any one of (100), (111), or (110), and thus the diamond crystal having such a configuration can be highly versatile in application such as formation of elements and devices or use as an underlying substrate for growth of diamond.

According to the diamond crystal of the embodiment, the diamond crystal has no grain boundaries. Further, though a diamond crystal has dislocation concentration regions, it has an orientational property sufficient for practical applications, with a reduced dispersion where the average of FWHMs measured at a plurality of positions at a surface thereof is not greater than 500 seconds and the standard deviation is from 10 seconds to 80 seconds. Such a diamond crystal can be realized by optimizing the interval between each of the dislocation concentration regions.

Furthermore, the diamond crystal is a crystal in a bulk form and has dislocation concentration regions and the orientation of crystal axis may partially vary, and thus the tolerance in orientation can be set to a larger value as compared to that of a single crystal. Then, a large diamond crystal can be more easily formed.

A method for producing a diamond crystal according to the embodiment is not particularly limited as long as the diamond crystal to be produced has dislocation concentration regions at an interval from 10 nm to 4000 nm. As a production method that can introduce dislocation concentration regions into the diamond crystal, a heteroepitaxial growth method using a material other than a diamond crystal for an underlying substrate for crystal growth can suitably employed. Among grown diamond crystals thus formed, a diamond crystal including dislocation concentration regions at an interval from 10 nm to 4000 nm may be selected.

Hereinafter, Examples according to the present technology will be described, but the present technology is not limited to only Examples described below.

EXAMPLES

Hereinafter, a diamond crystal according to Examples of the present technology will be described with reference to FIGS. 1 and 2.

First, as an underlying substrate for growing a diamond crystal, a MgO (magnesium oxide) substrate was prepared. The external shape of the MgO substrate in a surface direction was a rectangle (quadrangle) with a side length of 8.0 mm. A surface of the MgO substrate was mirror-polished. The surface roughness Ra was 10 nm. On the surface, an iridium (Ir) single crystal film was formed. On the Ir single crystal film, a diamond crystal was grown by a heteroepitaxial growth method.

The diamond crystal obtained by growth was partially cut by a focused ion beam (FIB) at a height of about 6.0 μm from the uppermost surface of the Ir single crystal film, to obtain a plurality of samples. One of images in which the cross sections of the samples were observed with TEM (magnification of 200000 times) is illustrated in FIG. 1. In the cross sections of the plurality of samples, the interval between each of dislocation concentration regions was measured by observation with TEM. The samples having the dislocation concentration regions at each interval from 10 nm to 4000 nm were classified for each interval observed with TEM.

For each of the selected samples, FWHM was measured at 10 positions at the surface of the sample, and the average and standard deviation of the FWHMs were calculated. A graph showing a relationship between the interval between each of the dislocation concentration regions, and the FWHM value (average value) is illustrated in FIG. 2, as the determined results. In FIG. 2, the horizontal axis (interval between each of the dislocation concentration regions) is in a logarithmic scale (base: 10).

Figure 2:
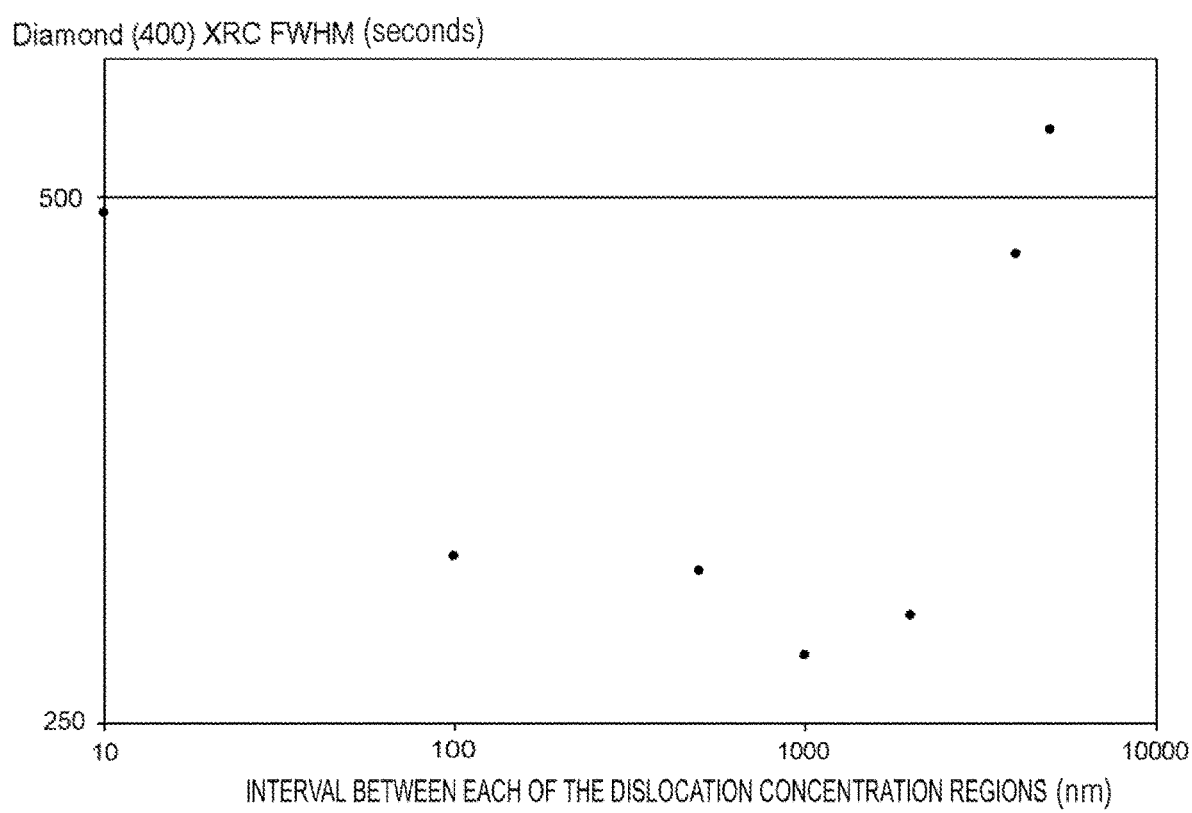
FIG. 2 is a graph showing a relationship between the interval between each of the dislocation concentration regions and a FWHM value (average) in Example of the diamond crystal of the present technology.

Successively from the left of the axis of the interval value in FIG. 2, for the interval between each of the dislocation concentration regions of 10 nm, 100 nm, 500 nm, 1000 nm, 3000 nm, or 4000 nm, the average of FWHMs was 490 seconds, 312 seconds, 306 seconds, 274 seconds, 289 seconds, or 464 seconds, respectively. In addition, the standard deviation of FWHMs was 76 seconds, 45 seconds, 25 seconds, 56 seconds, 14 seconds, or 53 seconds, respectively.

COMPARATIVE EXAMPLE

A diamond crystal was grown by the same heteroepitaxial growth method as that in Example, and partially cut by FIB at a height of about 6.0 μm from the uppermost surface of the Ir single crystal film, to obtain a plurality of samples. The cross sections of the samples were observed with TEM (magnification of 200000 times), and the samples of which the interval between each of the dislocation concentration regions was 5000 nm, which was greater than 4000 nm, were selected.

For each of the selected samples, FWHM was measured at 10 positions at the surface of the sample, and the average of the FWHMs was calculated. As a result, the average of FWHMs of a sample with the interval of 5000 nm on the rightmost side of FIG. 2 was 547 seconds. It was confirmed that, in Example, the average of FWHMs of the sample with the interval between each of the dislocation concentration regions of 4000 nm was not greater than 500 seconds, and, in Comparative Example, the average of FWHMs of the sample with the interval between each of the dislocation concentration regions of 5000 nm was greater than 500 seconds. Accordingly, in the present technology, the upper limit value of the interval between each of the dislocation concentration regions was set to 4000 nm.

The invention claimed is:

1. A diamond crystal comprising dislocation concentration regions, wherein:
   an interval between each of the dislocation concentration regions is from 10 nm to 4000 nm, and an average of FWHMs of diamond crystal is from 250 seconds to 500 seconds, and a standard deviation of the FWHMs is from 10 seconds to 80 seconds;
   the dislocation concentration regions refer to a region of dislocation concentration that extends toward the inside of the diamond crystal and is elongated along the thickness of the diamond crystal (in a growth direction of the diamond crystal);
   the interval between each of the dislocation concentration regions is measured by observation with TEM;
   a crystal orientation of a crystal main face at a surface of the diamond crystal is (100);
   an external shape of the diamond crystal in a surface direction is a rectangle or a circle, and in a case where the external shape is a rectangle, the rectangle has a side length of 8.0 mm to about 203.2 mm, and in a case where the external shape is a circle, the circle has a diameter of 8.0 mm to about 203.2 mm;
   the thickness of the diamond crystal is 0.3 mm to 3.0 mm; and
   the diamond crystal is independently existing crystal capable of keeping a fixed shape.

2. A method for producing a diamond crystal comprising dislocation concentration regions, comprising:
   using a heteroepitaxial growth method to produce a crystal of diamond having dislocation concentration regions;
   cutting the crystal to obtain a plurality of samples;
   observing the samples; and
   selecting a subset of the samples having an interval between each of the dislocation concentration regions of from 10 nm to 4000 nm, and an average of FWHMs of diamond crystal is from 250 seconds to 500 seconds, and a standard deviation of the FWHMs is from 10 seconds to 80 seconds, the subset of the samples being selected as the diamond crystal; wherein the dislocation concentration regions refer to a region of dislocation concentration that extends toward the inside of the diamond crystal and is elongated along the thickness of the diamond crystal (in a growth direction of the diamond crystal);

the interval between each of the dislocation concentration regions is measured by observation with TEM;

a crystal orientation of a crystal main face at a surface of the diamond crystal is (100);

an external shape of the diamond crystal in a surface direction is a rectangle or a circle, and in a case where the external shape is a rectangle, the rectangle has a side length of 8.0 mm to about 203.2 mm, and in a case where the external shape is a circle, the circle has a diameter of 8.0 mm to about 203.2 mm;

the thickness of the diamond crystal is 0.3 mm to 3.0 mm; and the diamond crystal is independently existing crystal capable of keeping a fixed shape.

* * * * *